(12) United States Patent
Xu et al.

(10) Patent No.: US 9,880,442 B2
(45) Date of Patent: Jan. 30, 2018

(54) DISPLAY PANEL, DISPLAY METHOD THEREOF AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Liyan Xu, Beijing (CN); Chunbing Zhang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/094,030

(22) Filed: Apr. 8, 2016

(65) Prior Publication Data
US 2016/0329381 A1  Nov. 10, 2016

(30) Foreign Application Priority Data
May 6, 2015 (CN) .......................... 2015 1 0226623

(51) Int. Cl.
*G02F 1/157* (2006.01)
*H01L 27/32* (2006.01)

(52) U.S. Cl.
CPC .......... *G02F 1/157* (2013.01); *H01L 27/3232* (2013.01); *H01L 27/3267* (2013.01)

(58) Field of Classification Search
CPC .. G02F 1/157; H01L 27/3232; H01L 27/3267
(Continued)

(56) References Cited

U.S. PATENT DOCUMENTS

2005/0264190 A1* 12/2005 Park .................... H01L 27/3232
                                                             313/506
2006/0066229 A1*  3/2006 Nimura ............... H01L 27/3267
                                                             313/506
(Continued)

FOREIGN PATENT DOCUMENTS

CN      102646697 A    8/2012
CN      104122671 A   10/2014
(Continued)

OTHER PUBLICATIONS

Office Action dated Sep. 5, 2016 issued in corresponding Chinese Application No. 201510226623.5.
(Continued)

*Primary Examiner* — Fernando L Toledo
*Assistant Examiner* — Adam S Bowen
(74) *Attorney, Agent, or Firm* — Nath, Goldberg & Meyer; Joshua B. Goldberg

(57) ABSTRACT

A display panel comprises a first substrate and a second substrate which are assembled to form a cell and a control unit. The first substrate is provided with a plurality of first light-emitting units which are double-sided light emitting devices thereon, and the second substrate is provided with a plurality of second light-emitting units which are double-sided light emitting devices thereon. The control unit is configured to control the first light-emitting units and the second light-emitting units to emit light or not to emit light. The display panel further comprises a grating-function layer interposed between the first substrate and the second substrate. The grating-function layer comprises controllable light blocking regions and controllable light transmissive regions, and the light blocking regions and the light transmissive regions cooperate with the first light-emitting units (Continued)

and the second light-emitting units to realize single-sided display or double-sided display.

18 Claims, 2 Drawing Sheets

(58) Field of Classification Search
USPC .......................................................... 257/40
See application file for complete search history.

(56) References Cited

U.S. PATENT DOCUMENTS

| | | | |
|---|---|---|---|
| 2007/0057629 A1* | 3/2007 | Lee | H01L 25/048 313/504 |
| 2007/0126349 A1* | 6/2007 | Hu | H01L 27/3267 313/506 |
| 2007/0164659 A1* | 7/2007 | Lee | G06F 3/1423 313/500 |
| 2008/0150422 A1* | 6/2008 | Ohara | H01L 51/5048 313/504 |
| 2008/0303982 A1* | 12/2008 | Jin | G02F 1/1335 349/69 |
| 2009/0278452 A1* | 11/2009 | Kim | H01L 25/048 313/504 |
| 2010/0252825 A1* | 10/2010 | Yamazaki | H01L 51/5281 257/40 |
| 2012/0176570 A1* | 7/2012 | Yamazaki | G02F 1/1334 349/86 |
| 2013/0126851 A1* | 5/2013 | Nishiyama | H01L 51/5215 257/40 |
| 2013/0234123 A1* | 9/2013 | Hirakata | H01L 27/3211 257/40 |
| 2013/0321482 A1* | 12/2013 | Goro | G09G 5/10 345/690 |
| 2014/0139992 A1* | 5/2014 | Yang | G06F 1/1601 361/679.21 |
| 2014/0252336 A1 | 9/2014 | Kobayashi | |
| 2014/0306204 A1* | 10/2014 | Niu | H01L 51/56 257/40 |
| 2015/0041766 A1* | 2/2015 | Naijo | H01L 27/3244 257/40 |
| 2015/0077316 A1* | 3/2015 | Sato | G09G 3/3208 345/77 |
| 2015/0168796 A1* | 6/2015 | Yashiro | G02F 1/1533 359/265 |
| 2015/0295015 A1* | 10/2015 | Yu | H01L 27/3251 257/88 |
| 2016/0011428 A1 | 1/2016 | Li et al. | |

FOREIGN PATENT DOCUMENTS

| | | |
|---|---|---|
| CN | 104269432 A | 1/2015 |
| CN | 104297968 A | 1/2015 |
| EP | 2 461 208 A1 | 6/2012 |

OTHER PUBLICATIONS

Office Action dated May 16, 2017 issued in corresponding Chinese Application No. 201510226623.5.

* cited by examiner

DISPLAY PANEL, DISPLAY METHOD THEREOF AND DISPLAY DEVICE

CROSS-REFERENCE TO RELATED APPLICATIONS

The present application claims the priority of Chinese Patent Application No. 201510226623.5, filed on May 6, 2015, the contents of which are incorporated herein in their entirety by reference.

FIELD OF THE INVENTION

The present invention relates to the field of display technology, and in particular, relates to a display panel, a display method of the display panel, and a display device.

BACKGROUND OF THE INVENTION

An organic light emitting diode (OLED) display panel has obvious advantages, such as self-luminescence, low power consumption, no visual dead angle, fast response, high contrast, and the like, over a liquid crystal display panel, and thus is considered to be the mainstream development trend of future display panels.

At present, most of the OLED display panels on the market mainly realize single-sided display. In many cases (e.g., in cases of digital signage, electronic communication equipment, cash register facility, inquiry facility, advertising facility at public places such as an exhibition hall and the like), it is often required that two persons can view a displayed screen at two opposite sides of a display panel at the same time. However, a double-sided display device in the prior art has a complicated structure, a high cost, and a single function. Thus, how to develop a double-sided display device with high integration has become a technical problem to be solved urgently.

SUMMARY OF THE INVENTION

In view of the above disadvantages of a display panel in the prior art, an object of the present invention is to provide a display panel, a display method of the display panel, and a display device, which can realize single-sided 2D display or double-sided display, and in the double-sided display, each side is capable of realizing 2D display and/or 3D display.

Some embodiments of the present invention provide a display panel including a first substrate and a second substrate which are assembled to form a cell and a control unit, the first substrate being provided with a plurality of first light-emitting units which are double-sided light emitting devices thereon, the second substrate being provided with a plurality of second light-emitting units which are double-sided light emitting devices thereon, the control unit being configured to control the first light-emitting units and the second light-emitting units to emit light or not to emit light, wherein:

the display panel further includes a grating-function layer interposed between the first substrate and the second substrate; and the grating-function layer includes controllable light blocking regions and controllable light transmissive regions, the light blocking regions and the light transmissive regions cooperate with the first light-emitting units and the second light-emitting units to realize single-sided 2D display or double-sided display, and in the double-sided display, each side is capable of realizing 2D display and/or 3D display.

Optionally, the grating-function layer includes a first-electrode layer and a second-electrode layer provided opposite to each other and an electrochromic layer provided between the first-electrode layer and the second-electrode layer;

the first-electrode layer includes a plurality of first electrodes, the second-electrode layer includes a plurality of second electrodes, each of the first electrodes is arranged corresponding to each of the second electrodes; and the electrochromic layer is configured to be in a light blocking state so as to form the light blocking regions of the grating-function layer when there is an electric field between the first electrodes and the second electrodes, and to be in a transparent state so as to form the light transmissive regions of the grating-function layer when there is no electric field between the first electrodes and the second electrodes.

Optionally, both each of the first electrodes and each of the second electrodes are strip electrodes.

Further optionally, both a projection of each of the first electrodes on the first substrate and a projection of each of the second electrodes on the first substrate coincide with a projection of one of the first light-emitting units on the first substrate or a projection of one of the second light-emitting units on the first substrate.

Further optionally, the electrochromic layer includes a plurality of electrochromic strips, each of which is provided between one of the first electrodes and one of the second electrodes.

Further optionally, both each of the first electrodes and each of the second electrodes are driven by a separate driving unit.

Optionally, both each of the first light-emitting units and each of the second light-emitting units have a same width, and both an interval between two adjacent first light-emitting units and an interval between two adjacent second light-emitting units have a same value equal to a width of one light-emitting unit.

Optionally, the plurality of first light-emitting units include a red light-emitting unit, a green light-emitting unit and a blue light-emitting unit, and the plurality of second light-emitting units include a red light-emitting unit, a green light-emitting unit and a blue light-emitting unit.

Optionally, both each of the first light-emitting units and each of the second light-emitting units are an OLED device, and the OLED device includes at least a first display electrode and a second display electrode provided opposite to each other and a light-emitting layer provided between the first display electrode and the second display electrode.

Optionally, both each of the first light-emitting units and each of the second light-emitting units are a WOLED device, and the WOLED device includes at least a color filter layer, a first display electrode and a second display electrode provided opposite to each other, and a light-emitting layer provided between the first display electrode and the second display electrode.

Further optionally, one of the first display electrode and the second display electrode is an anode, and the other of the first display electrode and the second display electrode is a cathode, wherein, the anode is made of a transparent electrode material, and the cathode is made of a translucent electrode material.

Optionally, the first substrate and the second substrate are provided with separate driving circuits, respectively, and display a same image or different images at a certain time.

Some embodiments of the present invention provide a display method of the display panel as described above, including steps of:

adjusting positions of the light blocking regions and the light transmissive regions of the grating-function layer, and controlling the plurality of first light-emitting units and the plurality of second light-emitting units to emit light or not to emit light, so as to realize single-sided 2D display or double-sided display of the display panel, wherein, in the double-sided display, each side is capable of realizing 2D display and/or 3D display.

Some embodiments of the present invention provide a display device including the display panel as described above.

The advantageous technical effects of the present invention are as follows.

In the present invention, by adding the grating-function layer into the display panel and controlling the grating-function layer, single-sided 2D display or double-sided display of the display panel is realized. In the double-sided display, each side is capable of realizing 2D display and/or 3D display, thereby diversifying the functions of the display panel according to the present invention.

The display method of the display panel according to the present invention is simple and easy to be implemented.

The display device according to the present invention can realize single-sided 2D display or double-sided display by including the display panel as described above. In the double-sided display, each side is capable of realizing 2D display and/or 3D display.

Figure 1:
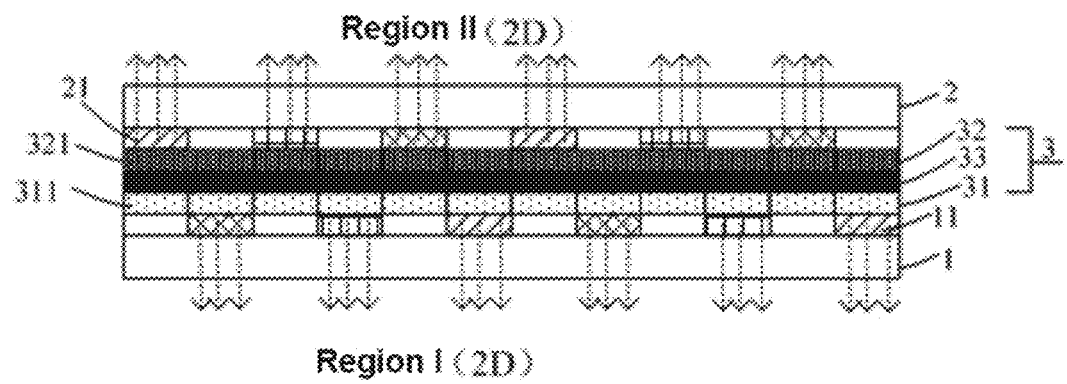
FIG. 1 is a schematic diagram of a display panel realizing double-sided 2D display according to embodiment 1 of the present invention.

REFERENCE NUMERALS 1. first substrate; 11. first light-emitting unit; 2. second substrate; 21. second light-emitting unit; 3. grating-function layer; 31. first-electrode layer; 311. first electrode; 32. second-electrode layer; 321. second electrode; 33. electrochromic layer.

DETAILED DESCRIPTION OF THE EMBODIMENTS

To make those skilled in the art better understand the technical solutions of the present invention, the present invention will be described below in detail with reference to the accompanying drawings and the following embodiments.

Embodiment 1

As shown in FIGS. 1 to 5, the present embodiment provides a display panel including a first substrate 1 and a second substrate 2 which are assembled to form a cell and a control unit (not shown in the figures). The first substrate 1 is provided with a plurality of first light-emitting units 11 which are double-sided light emitting devices thereon, and the second substrate 2 is provided with a plurality of second light-emitting units 21 which are double-sided light emitting devices thereon. The control unit is connected to the plurality of first light-emitting units 11 and the plurality of second light-emitting units 21, and is configured to control the first light-emitting units 11 and the second light-emitting units 21 to emit light or not to emit light, so as to realize single-sided display or double-sided display. The display panel according to the present embodiment further includes a grating-function layer 3 interposed between the first substrate 1 and the second substrate 2. The grating-function layer 3 includes controllable light blocking regions and controllable light transmissive regions, and the light blocking regions and the light transmissive regions cooperate with the first light-emitting units 11 and the second light-emitting units 21 to realize single-sided 2D display or double-sided display. In the double-sided display, each side is capable of realizing 2D display and/or 3D display.

It should be understood that, a double-sided light emitting device in the present invention refers to a light-emitting device capable of emitting light from two opposite surfaces at the same time.

It should be further understood that, the expression that the grating-function layer 3 includes controllable light blocking regions and controllable light transmissive regions means that "the light blocking regions of the grating-function layer 3 can be controlled to be light transmissive regions under a certain condition, and the light transmissive regions thereof can be controlled to be light blocking regions under a certain condition," which will be described in more detail below.

In the present embodiment, description is made by taking a case where the first light-emitting units 11 and the second light-emitting units 21 are arranged alternately in space as an example. However, a positional relationship between the first light-emitting units 11 and the second light-emitting units 21 is not limited to alternate arrangement in space. For example, projections thereof (on the first substrate 1, for example) may partially overlap each other.

For example, the grating-function layer 3 includes a first-electrode layer 31 and a second-electrode layer 32 provided opposite to each other and an electrochromic layer 33 provided between the first-electrode layer 31 and the second-electrode layer 32. The first-electrode layer 31 includes a plurality of first electrodes 311, and the second-electrode layer 32 includes a plurality of second electrodes 321, each of the first electrodes 311 being arranged corresponding to each of the second electrodes 321 (e.g., a projection of each of the first electrodes 311 on the first substrate 1 may coincide with a projection of a corresponding one of the second electrodes 321 on the first substrate 1). The electrochromic layer 33 is configured to be in a light blocking state so as to form the light blocking regions of the grating-function layer 3 when there is an electric field between the first electrodes 311 and the second electrodes 321, and to be in a transparent state so as to form the light transmissive regions of the grating-function layer 3 when there is no electric field between the first electrodes 311 and the second electrodes 321.

It should be noted that, in the present invention, at least the plurality of first electrodes 311 are electrically insulated from each other, or at least the plurality of second electrodes 321 are electrically insulated from each other, so that a desired voltage is applied to a pair of one first electrode 311 and one corresponding second electrode 321 so as to control the electrochromic layer 33 therebetween to be in a light blocking state or a transparent state. It is readily understood that both the plurality of first electrodes 311 and the plurality of second electrodes 321 may be electrically insulated from each other.

For example, both each of the first electrodes 311 and each of the second electrodes 321 may be strip electrodes. The strip electrodes are employed because they can be controlled easily and a manufacturing process thereof is simple. Of course, each of the first electrodes 311 and each of the second electrodes 321 are not limited to the strip electrodes, and may be electrodes of other shapes (e.g., square electrodes).

For example, both a projection of each of the first electrodes 311 on the first substrate 1 (or on the second substrate 2) and a projection of each of the second electrodes 321 on the first substrate 1 (or on the second substrate 2) coincide with a projection of one of the first light-emitting units 11 on the first substrate 1 (or on the second substrate 2) or a projection of one of the second light-emitting units 21 on the first substrate 1 (or on the second substrate 2).

Specifically, the display panel including the grating-function layer 3 will be further described in connection with a display method of the display panel. In this example, both each of the first electrodes 311 and each of the second electrodes 321 are strip electrodes.

The display method of the display panel provided by the present embodiment includes steps of: adjusting positions of the light blocking regions and the light transmissive regions of the grating-function layer 3, and controlling the plurality of first light-emitting units 11 and the plurality of second light-emitting units 21 to emit light or not to emit light, so as to realize single-sided 2D display or double-sided display of the display panel, wherein, in the double-sided display, each side is capable of realizing 2D display and/or 3D display. Detailed implementations thereof will be described below.

Firstly, a first display method of the display panel according to the present embodiment will be described.

As shown in FIG. 1, a voltage is applied to the first electrodes 311 of the first-electrode layer 31, and a different voltage is applied to the second electrodes 321 of the second-electrode layer 32. In this case, an electric field is formed between the first-electrode layer 31 and the second-electrode layer 32, to cause the electrochromic layer 33 to be in a light blocking state. Meanwhile, the control unit controls both the first light-emitting units 11 on the first substrate 1 and the second light-emitting units 21 on the second substrate 2 to emit light. As a result, double-sided 2D display of the display panel is realized, i.e., both region I and region II display 2D pictures. It should be understood that, in the present display method, if the control unit controls the first light-emitting units 11 on the first substrate 1 or the second light-emitting units 21 on the second substrate 2 to emit light, single-sided 2D display of the display panel can be realized.

Next, a second display method of the display panel according to the present embodiment will be described.

Figure 2:
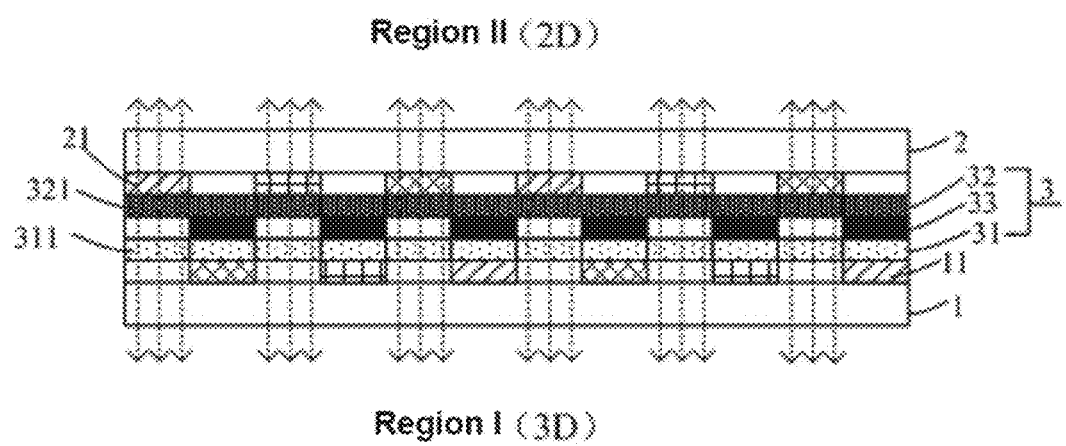
FIG. 2 is a schematic diagram of a display panel realizing 2D display at a side and 3D display at an opposite side according to embodiment 1 of the present invention.

As shown in FIG. 2, different voltages are applied to the first electrodes 311, which correspond to the first light-emitting units 11, of the first-electrode layer 31 and the second electrodes 321, which correspond to the first light-emitting units 11, of the second-electrode layer 32, respectively, and a same voltage or no voltage is applied to the first electrodes 311, which correspond to the second light-emitting units 21, of the first-electrode layer 31 and the second electrodes 321, which correspond to the second light-emitting units 21, of the second-electrode layer 32, respectively. In this case, an electric field is formed between the first electrodes 311 and the second electrodes 321 which correspond to the positions of the first light-emitting units 11, to cause regions of the electrochromic layer 33 at the positions to be in a light blocking state, i.e., to form the light blocking regions of the grating-function layer 3; no electric field is formed between the first electrodes 311 and the second electrodes 321 which correspond to the positions of the second light-emitting units 21, to cause regions of the electrochromic layer 33 at these positions to be in a light transmissive state, i.e., to form the light transmissive regions of the grating-function layer 3. Meanwhile, the control unit controls the second light-emitting units 21 to emit light, and controls the first light-emitting units 11 not to emit light. As a result, since the second light-emitting units 21 are double-sided light emitting devices, light emitted from the second light-emitting units 21 passes through the grating-function layer 3 to form a 3D picture at the side of the first substrate 1 (i.e., region I), and forms a 2D picture at the side of the second substrate 2 (i.e., region II).

It should be noted that, after the light blocking regions and the light transmissive regions of the grating-function layer 3 according to the present invention are realized, grating parameters of the grating-function layer 3 and arrangement of a left-eye image and a right-eye image on the plurality of first light-emitting units 11 and/or the plurality of second light-emitting units 21 may be set according to the technology for realizing the naked-eye 3D display in the prior art, so that the left eye of a viewer can only view the left-eye image and the right eye of the viewer can only view the right-eye image, thereby enabling the display panel according to the present invention to realize naked-eye 3D display. Thus, detailed description of setting of grating parameters of the grating-function layer 3 and arrangement of a left-eye image and a right-eye image is omitted herein.

Then, a third display method of the display panel according to the present embodiment will be described.

Figure 3:
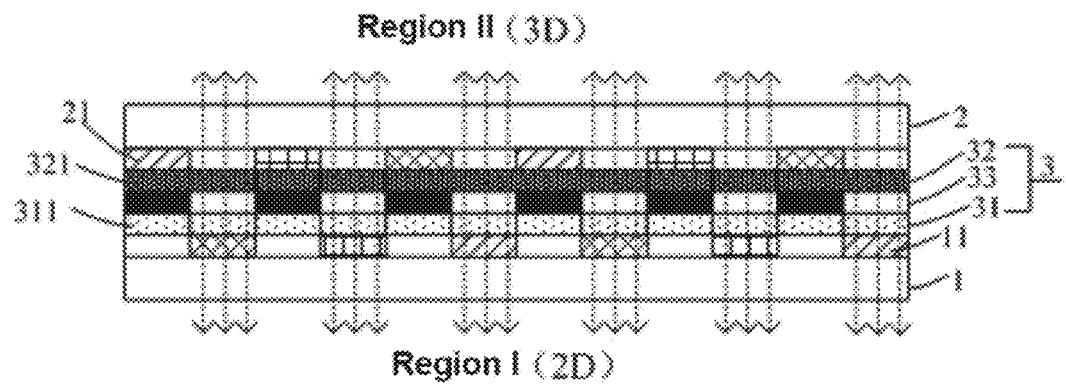
FIG. 3 is a schematic diagram of another display panel realizing 2D display at a side and 3D display at an opposite side according to embodiment 1 of the present invention.

As shown in FIG. 3, different voltages are applied to the first electrodes 311, which correspond to the second light-emitting units 21, of the first-electrode layer 31 and the second electrodes 321, which correspond to the second light-emitting units 21, of the second-electrode layer 32, respectively, and a same voltage or no voltage is applied to the first electrodes 311, which correspond to the first light-emitting units 11, of the first-electrode layer 31 and the second electrodes 321, which correspond to the first light-emitting units 11, of the second-electrode layer 32, respectively. In this case, an electric field is formed between the first electrodes 311 and the second electrodes 321 which correspond to the positions of the second light-emitting units 21, to cause regions of the electrochromic layer 33 at the positions to be in a light blocking state, i.e., to form the light blocking regions of the grating-function layer 3; no electric field is formed between the first electrodes 311 and the second electrodes 321 which correspond to the positions of the first light-emitting units 11, to cause regions of the electrochromic layer 33 at these positions to be in a light transmissive state, i.e., to form the light transmissive regions of the grating-function layer 3. Meanwhile, the control unit controls the first light-emitting units 11 to emit light, and controls the second light-emitting units 21 not to emit light. As a result, since the first light-emitting units 11 are double-sided light emitting devices, light emitted from the first light-emitting units 11 passes through the grating-function layer 3 to form a 3D picture at the side of the second substrate 2 (i.e., region II), and forms a 2D picture at the side of the first substrate 1 (i.e., region I).

Next, a fourth display method of the display panel according to the present embodiment will be described.

Figure 4:
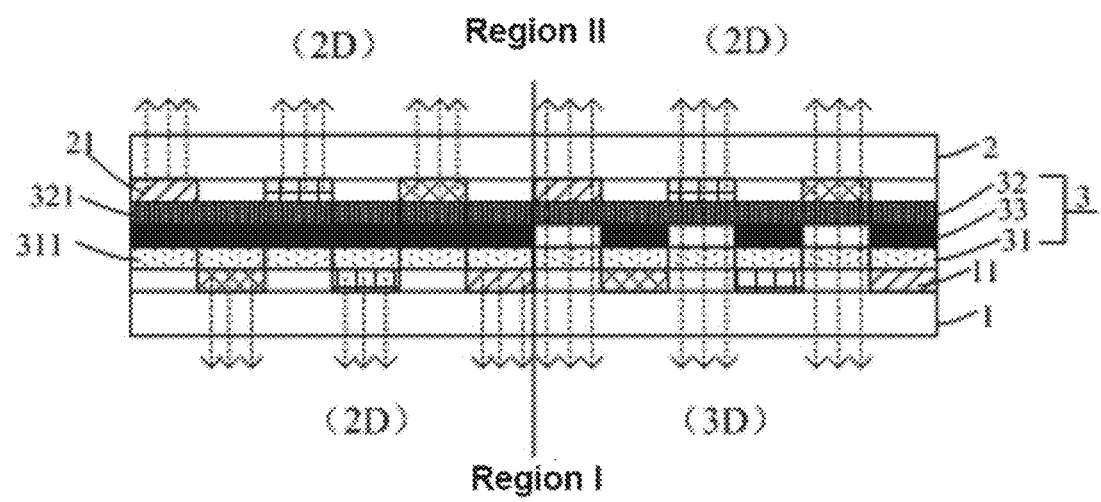
FIG. 4 is a schematic diagram of a display panel realizing double-sided 2D display in a portion and realizing 2D display at a side and 3D display at an opposite side in the remaining portion according to embodiment 1 of the present invention.

As shown in FIG. 4, firstly, the display panel is divided into two portions: a left portion and a right portion. Then, different voltages are applied to the first electrodes 311 and the second electrodes 321 in the left portion, respectively. In this case, an electric field is formed between the first electrodes 311 and the second electrodes 321 in the left portion, to cause regions of the electrochromic layer 33 in the left portion to be in a light blocking state. Meanwhile, the control unit controls both the first light-emitting units 11 and the second light-emitting units 21 in the left portion to emit light. As a result, double-sided 2D display in the left portion of the display panel is realized, i.e., both region I and region II in the left portion display 2D pictures. At the same time, different voltages are applied to the first electrodes 311 and the second electrodes 321 which correspond to the first light-emitting units 11 in the right portion of the display panel, respectively, and a same voltage or no voltage is applied to the first electrodes 311 and the second electrodes 321 which correspond to the second light-emitting units 21 in the right portion of the display panel, respectively. In this case, an electric field is formed between the first electrodes 311 and the second electrodes 321 which correspond to the positions of the first light-emitting units 11, to cause regions of the electrochromic layer 33 at the positions to be in a light blocking state, i.e., to form the light blocking regions of the grating-function layer 3; no electric field is formed between the first electrodes 311 and the second electrodes 321 which correspond to the positions of the second light-emitting units 21, to cause regions of the electrochromic layer 33 at these positions to be in a light transmissive state, i.e., to form the light transmissive regions of the grating-function layer 3. Meanwhile, the control unit controls the second light-emitting units 21 in the right portion of the display panel to emit light, and controls the first light-emitting units 11 in the right portion of the display panel not to emit light. As a result, since the second light-emitting units 21 are double-sided light emitting devices, light emitted from the second light-emitting units 21 in the right portion of the display panel passes through the grating-function layer 3 to form a 3D picture at the side of the first substrate 1 (i.e., region I), and forms a 2D picture at the side of the second substrate 2 (i.e., region II).

Further, according to the same principle as that of the fourth display method of the display panel, a picture displayed in the left portion of the display panel and a picture displayed in the right portion of the display panel can be switched, and a displayed 2D picture and a displayed 3D picture can also be switched.

Finally, a fifth display method of the display panel according to the present embodiment will be described.

Figure 5:
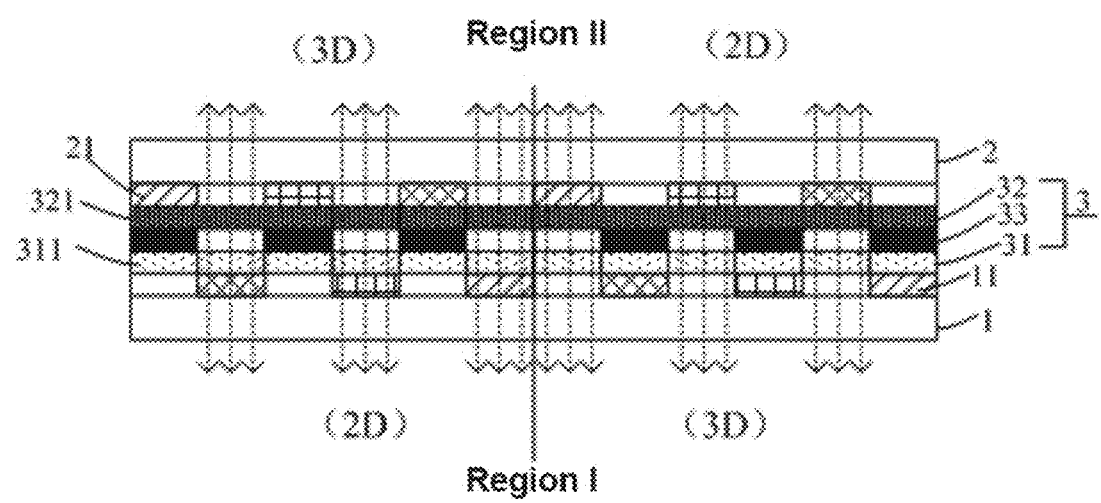
FIG. 5 is a schematic diagram of a display panel realizing both 2D display and 3D display at two opposite sides according to embodiment 1 of the present invention.

As shown in FIG. 5, firstly, the display panel is divided into two portions: a left portion and a right portion. Then, different voltages are applied to the first electrodes 311 and the second electrodes 321 which correspond to the second light-emitting units 21 in the left portion of the display panel, respectively, and a same voltage or no voltage is applied to the first electrodes 311 and the second electrodes 321 which correspond to the first light-emitting units 11 in the left portion of the display panel, respectively. In this case, an electric field is formed between the first electrodes 311 and the second electrodes 321 which correspond to the positions of the second light-emitting units 21 in the left portion of the display panel, to cause regions of the electrochromic layer 33 at the positions to be in a light blocking state, i.e., to form the light blocking regions of the grating-function layer 3; no electric field is formed between the first electrodes 311 and the second electrodes 321 which correspond to the positions of the first light-emitting units 11 in the left portion of the display panel, to cause regions of the electrochromic layer 33 at these positions to be in a light transmissive state, i.e., to form the light transmissive regions of the grating-function layer 3. Meanwhile, the control unit controls the first light-emitting units 11 in the left portion of the display panel to emit light, and controls the second light-emitting units 21 in the left portion of the display panel not to emit light. As a result, since the first light-emitting units 11 are double-sided light emitting devices, light emitted from the first light-emitting units 11 in the left portion of the display panel passes through the grating-function layer 3 to form a 3D picture at the side of the second substrate 2 (i.e., region II), and forms a 2D picture at the side of the first substrate 1 (i.e., region I). At the same time, different voltages are applied to the first electrodes 311 and the second electrodes 321 which correspond to the first light-emitting units 11 in the right portion of the display panel, respectively, and a same voltage or no voltage is applied to the first electrodes 311 and the second electrodes 321 which correspond to the second light-emitting units 21 in the right portion of the display panel, respectively. In this case, an electric field is formed between the first electrodes 311 and the second electrodes 321 which correspond to the positions of the first light-emitting units 11 in the right portion of the display panel, to cause regions of the electrochromic layer 33 at the positions to be in a light blocking state, i.e., to form the light blocking regions of the grating-function layer 3; no electric field is formed between the first electrodes 311 and the second electrodes 321 which correspond to the positions of the second light-emitting units 21 in the right portion of the display panel, to cause regions of the electrochromic layer 33 at these positions to be in a light transmissive state, i.e., to form the light transmissive regions of the grating-function layer 3. Meanwhile, the control unit controls the second light-emitting units 21 in the right portion of the display panel to emit light, and controls the first light-emitting units 11 in the right portion of the display panel not to emit light. As a result, since the second light-emitting units 21 are double-sided light emitting devices, light emitted from the second light-emitting units 21 in the right portion of the display panel passes through the grating-function layer 3 to form a 3D picture at the side of the first substrate 1 (i.e., region I), and forms a 2D picture at the side of the second substrate 2 (i.e., region II). It can be seen that, in the present display method, the display panel realizes both 2D display and 3D display at two opposite sides.

Optionally, the electrochromic layer 33 in the grating-function layer 3 includes a plurality of electrochromic strips, each of which is provided between one of the first electrodes 311 and one of the second electrodes 321. This arrangement facilitates control of the light blocking regions and the light transmissive regions of the grating-function layer 3.

Optionally, both each of the first electrodes 311 and each of the second electrodes 321 in the grating-function layer 3 are driven by a separate driving unit. This arrangement facilitates flexible control of the light blocking regions and the light transmissive regions of the grating-function layer 3, thereby switching between 2D display and 3D display easily.

Optionally, both each of the first light-emitting units 11 and each of the second light-emitting units 21 have a same width, and both an interval between two adjacent first light-emitting units 11 and an interval between two adjacent second light-emitting units 21 have a same value equal to a width of one light-emitting unit (i.e., one first light-emitting unit 11 or one second light-emitting unit 21).

That is, a position on the first substrate 1 which is not provided with a first light-emitting unit 11 corresponds to a position on the second substrate 2 which is provided with a second light-emitting unit 21. Similarly, a position on the second substrate 2 which is not provided with a second light-emitting unit 21 corresponds to a position on the first substrate 1 which is provided with a first light-emitting unit 11. Thus, when the display panel displays, the structure of pixels is compact, and the resolution of the pixels is improved.

Optionally, the plurality of first light-emitting units 11 include a red light-emitting unit, a green light-emitting unit and a blue light-emitting unit, and the plurality of second light-emitting units 12 include a red light-emitting unit, a green light-emitting unit and a blue light-emitting unit. Both the first and second light-emitting units are arranged in periodic cycle in color. Three light-emitting units in different colors of red, green and blue constitute a pixel unit, so as to form full-color pixel units on both the first substrate 1 and the second substrate 2 of the display panel.

Optionally, both each of the first light-emitting units 11 and each of the second light-emitting units 21 in the present embodiment are an OLED device, and the OLED device includes at least a first display electrode and a second display electrode provided opposite to each other and a light-emitting layer provided between the first display electrode and the second display electrode. Alternatively, both each of the first light-emitting units 11 and each of the second light-emitting units 21 are a WOLED (i.e., White OLED) device, and the WOLED device includes at least a color filter layer, a first display electrode and a second display electrode provided opposite to each other, and a light-emitting layer provided between the first display electrode and the second display electrode.

By employing the OLED device or the WOLED device, it is easy to realize the effect of double-sided light emitting and to make the display panel be lighter and thinner. In addition, it is easily understood that, the OLED device or the WOLED device may further include other functional layers such as a hole transport layer, an electron transport layer, and the like to further increase the performance of each of the light-emitting units, and the present invention is not limited thereto.

In the OLED device or the WOLED device, one of the first display electrode and the second display electrode is an anode, and the other of the first display electrode and the second display electrode is a cathode. The anode may be made of a transparent electrode material such as indium tin oxide (ITO), indium gallium tin oxide (IGTO), and the like. The cathode may be made of a translucent electrode material such as copper (Cu), aluminum (Al), silver (Ag), and the like. It should be noted that, a material of metal is generally not transparent. However, a translucent cathode can be obtained by making a metal film be very thin when a cathode is manufactured, thereby enabling the OLED device or the WOLED device to emit light from two opposite sides.

Optionally, in the present embodiment, the first substrate 1 and the second substrate 2 of the display panel are provided with separate driving circuits, respectively, and display a same image or different images at a certain time. That is, the display panel provided by the present embodiment can display a greater variety of contents.

Embodiment 2

The present embodiment provides a display device including the display panel according to embodiment 1. Thus, the display device according to the present embodiment can realize single-sided 2D display or double-sided display, and in the double-sided display, each side is capable of realizing 2D display and/or 3D display.

The display device may be any product or component having a display function, such as a mobile phone, a tablet computer, a television set, a display, a laptop computer, a digital photo frame, a navigator, and the like.

Of course, the display device according to the present embodiment may include other conventional structures such as a power supply unit, a display driving unit, and the like.

It should be understood that, the foregoing embodiments are only exemplary embodiments used for explaining the principle of the present invention, but the present invention is not limited thereto. Various variations and improvements may be made by a person skilled in the art without departing from the protection scope of the present invention, and these variations and improvements also fall into the protection scope of the present invention.

What is claimed is:

1. A display panel comprising a first substrate and a second substrate which are assembled to form a cell and a control unit, the first substrate being provided with a plurality of first light-emitting units which are double-sided light emitting devices thereon, the second substrate being provided with a plurality of second light-emitting units which are double-sided light emitting devices thereon, the control unit being configured to control the first light-emitting units and the second light-emitting units to emit light or not to emit light, wherein:

the display panel further comprises a grating-function layer interposed between the first substrate and the second substrate; and the grating-function layer comprises controllable light blocking regions and controllable light transmissive regions, the controllable light blocking regions are controlled to change into light transmissive regions under a first predetermined condition, the controllable light transmissive regions are controlled to change into light blocking regions under a second predetermined condition, the light blocking regions and the light transmissive regions cooperate with the first light-emitting units and the second light-emitting units to realize single-sided 2D display or double-sided display, and in the double-sided display, each side is capable of realizing 2D display and/or 3D display.

2. The display panel according to claim 1, wherein, the grating-function layer comprises a first-electrode layer and a second-electrode layer provided opposite to each other and an electrochromic layer provided between the first-electrode layer and the second-electrode layer;

the first-electrode layer comprises a plurality of first electrodes, the second-electrode layer comprises a plurality of second electrodes, each of the first electrodes is arranged corresponding to each of the second electrodes; and the electrochromic layer is configured to be in a light blocking state so as to form the light blocking regions of the grating-function layer when there is an electric field between the first electrodes and the second electrodes, and to be in a transparent state so as to form the light transmissive regions of the grating-function layer when there is no electric field between the first electrodes and the second electrodes.

3. The display panel according to claim 2, wherein, both each of the first electrodes and each of the second electrodes are strip electrodes.

4. The display panel according to claim 2, wherein, both a projection of each of the first electrodes on the first substrate and a projection of each of the second electrodes on the first substrate coincide with a projection of one of the first light-emitting units on the first substrate or a projection of one of the second light-emitting units on the first substrate.

5. The display panel according to claim 3, wherein, both a projection of each of the first electrodes on the first substrate and a projection of each of the second electrodes on the first substrate coincide with a projection of one of the first light-emitting units on the first substrate or a projection of one of the second light-emitting units on the first substrate.

6. The display panel according to claim 2, wherein, the electrochromic layer comprises a plurality of electrochromic strips, each of which is provided between one of the first electrodes and one of the second electrodes.

7. The display panel according to claim 3, wherein, the electrochromic layer comprises a plurality of electrochromic strips, each of which is provided between one of the first electrodes and one of the second electrodes.

8. The display panel according to claim 2, wherein, both each of the first electrodes and each of the second electrodes are driven by a separate driving unit.

9. The display panel according to claim 3, wherein, both each of the first electrodes and each of the second electrodes are driven by a separate driving unit.

10. The display panel according to claim 1, wherein, both each of the first light-emitting units and each of the second light-emitting units have a same width, and both an interval between two adjacent first light-emitting units and an interval between two adjacent second light-emitting units have a same value equal to a width of one light-emitting unit.

11. The display panel according to claim 1, wherein, the plurality of first light-emitting units comprise a red light-emitting unit, a green light-emitting unit and a blue light-emitting unit, and the plurality of second light-emitting units comprise a red light-emitting unit, a green light-emitting unit and a blue light-emitting unit.

12. The display panel according to claim 1, wherein, both each of the first light-emitting units and each of the second light-emitting units are an OLED device, and the OLED device comprises at least a first display electrode and a second display electrode provided opposite to each other and a light-emitting layer provided between the first display electrode and the second display electrode.

13. The display panel according to claim 1, wherein, both each of the first light-emitting units and each of the second light-emitting units are a WOLED device, and the WOLED device comprises at least a color filter layer, a first display electrode and a second display electrode provided opposite to each other, and a light-emitting layer provided between the first display electrode and the second display electrode.

14. The display panel according to claim 12, wherein, one of the first display electrode and the second display electrode is an anode, and the other of the first display electrode and the second display electrode is a cathode, wherein, the anode is made of a transparent electrode material, and the cathode is made of a translucent electrode material.

15. The display panel according to claim 13, wherein, one of the first display electrode and the second display electrode is an anode, and the other of the first display electrode and the second display electrode is a cathode, wherein, the anode is made of a transparent electrode material, and the cathode is made of a translucent electrode material.

16. The display panel according to claim 1, wherein, the first substrate and the second substrate are provided with separate driving circuits, respectively, and display a same image or different images at a certain time.

17. A display method of the display panel according to claim 1, comprising steps of:
adjusting positions of the light blocking regions and the light transmissive regions of the grating-function layer, and controlling the plurality of first light-emitting units and the plurality of second light-emitting units to emit light or not to emit light, so as to realize single-sided 2D display or double-sided display of the display panel, wherein, in the double-sided display, each side is capable of realizing 2D display and/or 3D display.

18. A display device, comprising the display panel according to claim 1.

* * * * *